(12) United States Patent
Goktepeli et al.

(10) Patent No.: US 7,323,389 B2
(45) Date of Patent: Jan. 29, 2008

(54) METHOD OF FORMING A FINFET STRUCTURE

(75) Inventors: Sinan Goktepeli, Austin, TX (US); Voon-Yew Thean, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 371 days.

(21) Appl. No.: 11/190,411

(22) Filed: Jul. 27, 2005

(65) Prior Publication Data

US 2007/0026615 A1 Feb. 1, 2007

(51) Int. Cl.
*H01L 21/336* (2006.01)
*H01L 21/338* (2006.01)

(52) U.S. Cl. ............... 438/281; 438/173; 257/E21.014; 257/E21.538

(58) Field of Classification Search ............... 438/281, 438/173, 174, 175; 257/E21.014, E21.538, 257/E21.156, E21.165, E21.591
See application file for complete search history.

(56) References Cited

U.S. PATENT DOCUMENTS

| | | | |
|---|---|---|---|
| 4,992,387 A * | 2/1991 | Tamura | ............... 438/174 |
| 6,124,627 A | 9/2000 | Rodder et al. | |
| 6,475,869 B1 * | 11/2002 | Yu | ............... 438/303 |
| 6,638,802 B1 | 10/2003 | Hwang et al. | |
| 6,746,924 B1 | 6/2004 | Lee et al. | |
| 6,838,322 B2 | 1/2005 | Pham et al. | |
| 6,855,606 B2 * | 2/2005 | Chen et al. | ............... 438/283 |
| 2004/0075151 A1 | 4/2004 | Fung et al. | |
| 2004/0209404 A1 * | 10/2004 | Wang et al. | ............... 438/132 |
| 2004/0217392 A1 | 11/2004 | Mathew et al. | |

FOREIGN PATENT DOCUMENTS

WO      WO 02/45156 A2      6/2002

OTHER PUBLICATIONS

Kim, Sung Min et al.; "Fully Working High Performance Multi-channel Field Effect Transistor (McFET) SRAM Cell on Bulk Si substrate Using TiN Single Metal Gate"; 2005 Symposium of VLSI Technology Digest of Technical Papers; 2005; pp. 196-197.

(Continued)

*Primary Examiner*—Walter Lindsay, Jr.
(74) *Attorney, Agent, or Firm*—Robert L. King; James L. Clingan, Jr.

(57) ABSTRACT

A semiconductor device (10) such as a FinFET transistor of small dimensions is formed in a process that permits substantially uniform ion implanting (32) of a source (14) electrode and a drain (16) electrode adjacent to an intervening gate (18) and channel (23) connected via source/drain extensions (22, 24) which form a fin. At small dimensions, ion implanting may cause irreparable crystal damage to any thin areas of silicon such as the fin area. To permit a high concentration/low resistance source/drain extension, a sacrificial doping layer (28, 30) is formed on the sides of the fin area. Dopants from the sacrificial doping layer are diffused into the source electrode and the drain electrode using heat. Subsequently a substantial portion, or all, of the sacrificial doping layer is removed from the fin.

20 Claims, 5 Drawing Sheets

OTHER PUBLICATIONS

Verheyen P., "25% Drive Current Improvement for p-type Multiple Gate FET (MuGFET) Devices by the Introduction of Recessed $Si_{0.8}Ge_{0.2}$ in the Source and Drain Regions"; 2005 Symposium on VLSI Technology Digest of Technical Papers; 2005; pp. 194-195.

Jung, Jongwan et al.; "Implementation of Both High-Hole and Electron Mobility in Strained Si/Strained $Si_{1-y}$ $Ge_y$ on Relaxed $Si_{1-x}Ge_x$ (x<y) Virtual Substrate"; IEEE Electron Device Letters; Jul. 2003; pp. 460-462; vol. 24, No. 7; IEEE.

Kedzierski, Jakub et al.; "Extension and Source/Drain Design for High-Performance FinFET Devices"; IEEE Transactions on Electron Devices; Apr. 2003; pp. 952-958; vol. 50, No. 4; IEEE.

Shima, M. et al.; "<100> Channel Strained SiGe p-MOSFET with Enhanced Hole Mobility and Lower Parasitic Resistance"; 2002 Symposium of VLSI Technology Digest of Technical Papers; 2002; pp. 94-95; IEEE.

Choi, Yang-Kyu et al.; "Sub 20nm CMOS FinFET Technologies"; 2001; 4 pgs; IEEE.

Yeo, Yeo-Chia et al.; "Nanoscale Ultra-Thin-Body Silicon-on-Insulator P-MOSFET with a SiGe/Si Heterostructure Channel"; IEEE Electron Device Letters; Apr. 2000; pp. 161-163; vol. 21, No. 4; IEEE.

U.S. Appl. No. 11/047,946 filed Feb. 1, 2005.
U.S. Appl. No. 10/952,676 filed Sep. 29, 2004.
U.S. Appl. No. 10/954,121 filed Sep. 29, 2004.

* cited by examiner

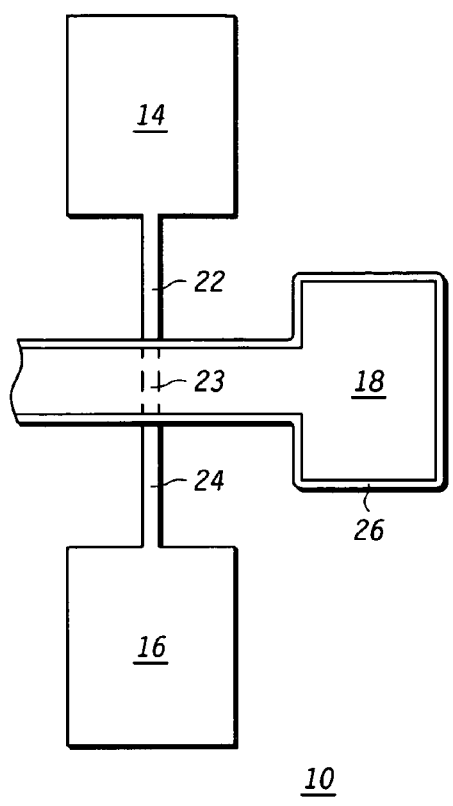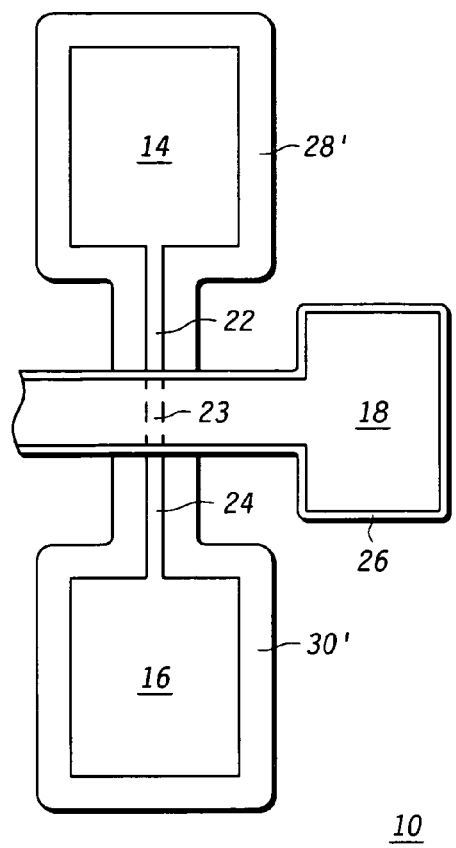
FIG. 8                              FIG. 9

US 7,323,389 B2

METHOD OF FORMING A FINFET STRUCTURE

FIELD OF THE INVENTION

This invention relates generally to semiconductors, and more specifically, to making semiconductor devices having very small dimensions.

BACKGROUND OF THE INVENTION

As transistor sizes continue to be scaled to smaller and smaller dimensions, different types of ultra thin-body transistor structures have been proposed. For example, double gated transistors permit twice the drive current and have an inherent coupling between the gates and channel that makes the design amenable to scaling.

With reduced size gate lengths, many transistors have difficulty in maintaining high drive current with low leakage while not demonstrating short-channel effects such as leakage and threshold voltage stability. Bulk silicon planar CMOS transistors typically overcome these problems by scaling polysilicon gates and oxides, using super-steep retrograde wells (often triple wells), abrupt source/drain junctions and highly doped channels. At some point, however, intense channel doping begins to degrade carrier mobility and junction characteristics.

As the length of transistor gates become ever smaller, electrostatic control of the resulting short transistor channel by the gate electrode becomes difficult. In particular, control of off-state leakage current between the source and the drain is reduced. As channel lengths are reduced, others have increased channel implants of conventional planar single-gated bulk or partially-depleted SOI (silicon on insulator) devices to improve control of electrons in the short transistor channel and reduce off-state current leakage. Unfortunately, significantly increasing the doping of the transistor's channel causes severe degradation of the channel electron mobility and thus leads to reduced transistor drive current. Other transistor structures have been proposed that improve the electrostatic control over the source/drain current leakage through a thin body structure and enhance electrostatic influence of the gate on carriers (holes or electrons) in the transistor channel. Such transistor structures include undoped ultra-thin channel devices like single-gate and multiple-gate fully-depleted devices with undoped ultra-thin channels. Multiple gate fully-depleted transistors provide the best short-channel control. The two gates control roughly twice as much current as a single gate, which allows them to produce significantly stronger switching signals. The two-gate design provides inherent electrostatic and hot-carrier coupling in the channel. This intimate coupling between the gates and channel makes double-gated MOSFET technology one of the most scalable of all FET designs.

The FINFET transistor is a double-gated MOSFET (MOS field effect transistor) device wherein the gate structure wraps around a thin silicon body that forms a structure resembling a fin. The FINFET includes a forward protruding source and a backward protruding drain, both of which extend from the gate by an extension region which is the fin. Forming the extension region or the fin is a major issue because ion implantation of the source and drain regions may cause significant damage to the extension region since is it thin and subject to full penetration by implanted ions. In particular, the ion implantation may fully amorphize the extension region resulting in a polycrystalline extension region rather than single crystalline which degrades the carrier mobility and lowers the drive current.

BRIEF DESCRIPTION OF THE DRAWINGS

The present invention is illustrated by way of example and not limited to the accompanying figures, in which like references indicate similar elements.

FIG. 8 illustrates in plan-view form further processing of the semiconductor device of FIG. 7; and FIG. 9 illustrates in plan-view form further processing of the semiconductor device of FIG. 8.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

As transistor gate lengths are reduced in size, there is a need for increasingly thinner silicon for the channel of a transistor. However this need is contrary to a need for thicker silicon in the source/drain extensions and source/drain regions in order to reduce parasitic resistance. Doped selective epitaxy may be used to thicken the source/drain extension regions. The doped selective epitaxy increases the parasitic capacitance between the transistor gate and extension region due to fringing electric fields from the side walls of the transistor's gate.

The extremely thin silicon and tall vertical structure of the fin poses several challenges to doping of source/drain extensions and source/drain regions by conventional high dose ion implantation. Very thin silicon (i.e. less than 100 Angstroms) does not have sufficient stopping power or volume to retard the high-energy dopant ions from ion implantation, leading to severe dose loss. High dose ion-implantation causes excessive crystal damage, such as amorphization, from which a thin silicon layer cannot fully recover due to insufficient silicon volume for epitaxial recrystallization. Furthermore, it is difficult to control the lateral diffusion of the source/drain dopants into the channel without the use of amorphizing implants. Also, the need to use angled and tilted implants for the source/drain extension and source/drain regions leads to vertical variation in the implant profile due to channeling in this silicon leading to sever channel length variation along the side of the tall structure.

The problems associated with doping of the source/drain extensions and source/drain regions can be overcome by providing a thick amorphous, polycrystalline, or crystalline sacrificial doping layer to be described below in connection with the figures. The sacrificial doping layer is selectively or unselectively grown on the vertical device which functions as a dopant source to dope the thin source/drain regions, source/drain extensions, or the gate through solid-phase diffusion of the dopants from the pre-doped sacrificial doping layer. The sacrificial doping layer can be pre-doped through high-level in-situ incorporation of the dopants, generally greater than E18 cm$^3$, but can be lower, during the growth process or through high-dose ion implantation. The sacrificial dopant layer can be removed substantially or completely after the doping process depending on the need of the device structure.

Figure 1:
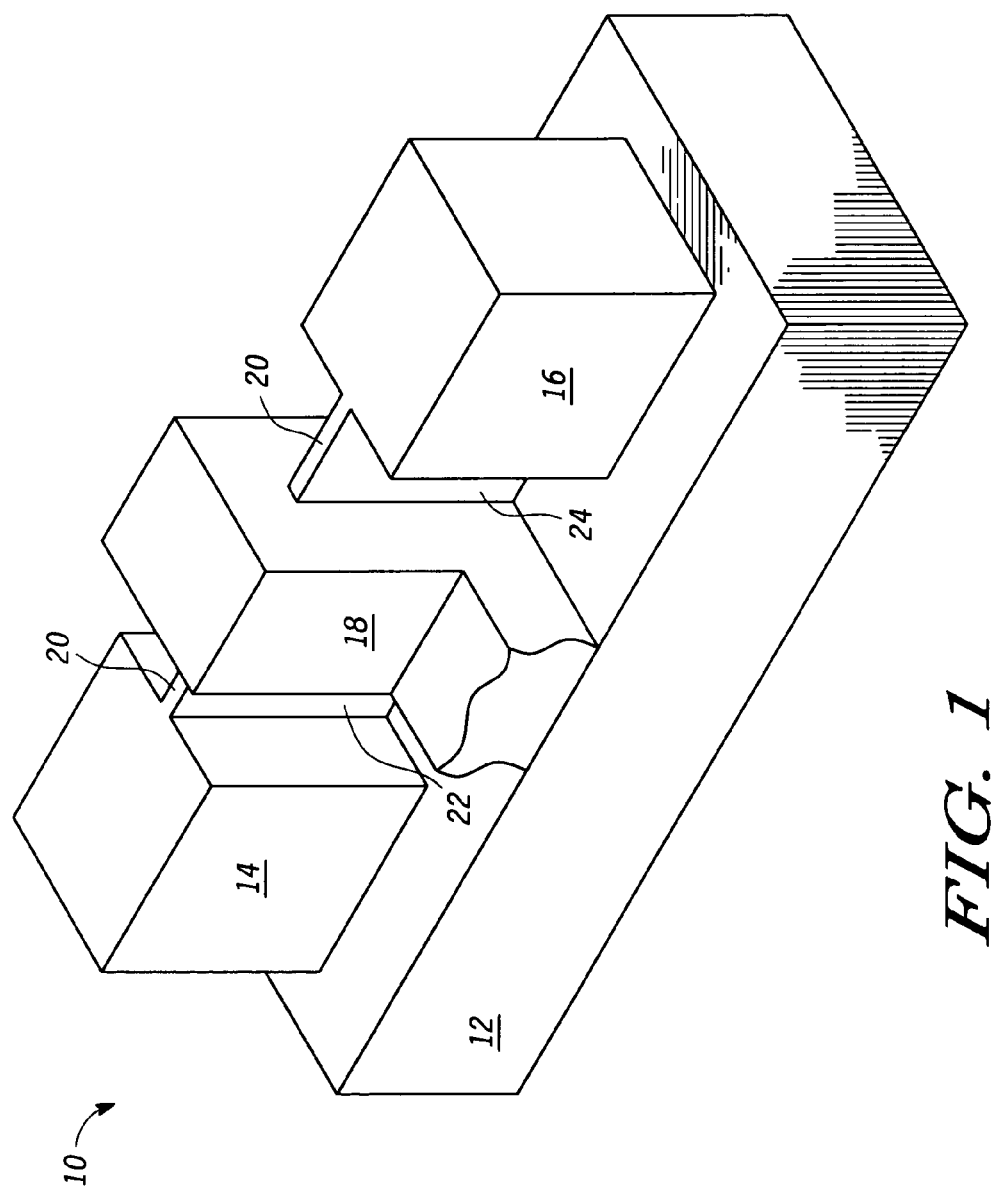
FIG. 1 illustrates in perspective form a semiconductor device at a stage in processing.

Illustrated in FIG. 1 is a semiconductor device 10 comprising a substrate 12, a conformal layer on the substrate 12 which is patterned to form source/drain contact regions 14 and 16 and a fin 20 which forms extension regions 22 and 24, and a gate feature 18. The formation of these features is achieved by depositing a semiconductor layer on the substrate 12, patterning the semiconductor layer to form the source/drain contact regions 14 and 16 and the fin 20 such that the width of fin 20 is substantially less than the width of the source/drain contact regions 14. Also, the height of fin 20 is typically at least five times greater that the width of fin 20. A second layer is deposited on the semiconductor layer and patterned to form the gate feature 18 which divides fin 20 into the extension regions 22 and 24. Substrate 12 is preferably silicon oxide but could be a different semiconductor material such as silicon, silicon germanium, silicon germanium carbon, silicon carbide, or germanium or a different dielectric such as silicon nitride. The semiconductor layer which forms the source/drain contact regions 14 and 16 and fin 20 is preferably silicon or silicon germanium but could be a different semiconductor material such as silicon germanium carbon, silicon carbide or a periodic table group III-V material such as gallium arsenide. The gate feature 18 is preferably a conductive material such as polysilicon but can be different conductive material. In an alternative embodiment in which the gate of the transistor is formed later, gate feature 18 can initially be a dielectric material such a silicon nitride with silicon oxide. In such an alternative embodiment, the initial dielectric material will be later replaced with a conductive gate material as will be discussed below at the appropriate point in the method. It should be understood that in an another form, the substrate 12 may be formed over an insulator and form a silicon-on-insulator (SOI) structure.

Figure 2:
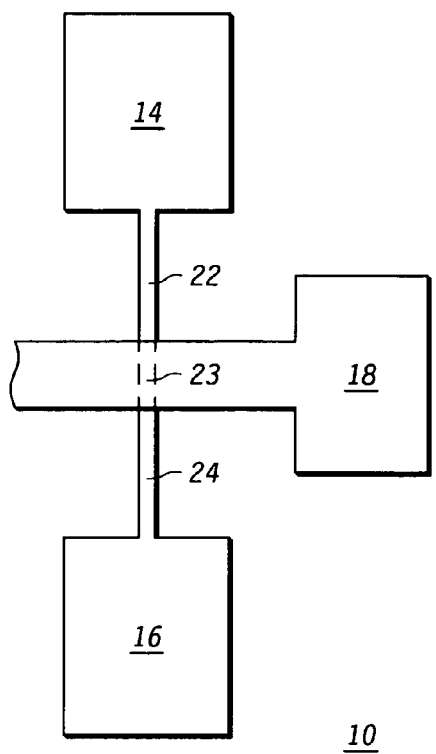
FIG. 2 illustrates in plan-view form further processing of the semiconductor device of FIG. 1.

Illustrated in FIG. 2 is a top or plan view of the semiconductor device 10 of FIG. 1 with a channel 23 that is underlying the gate feature 18 and separating the extension region 22 from extension region 24. The gate feature 18 intersects the extension regions 22 and 24 substantially orthogonal and extends laterally to the sides thereof. On at least one side of the extension regions 22 and 24 the gate feature 18 has the surface area thereof for the purpose of making electrical contact thereto.

Figure 3:
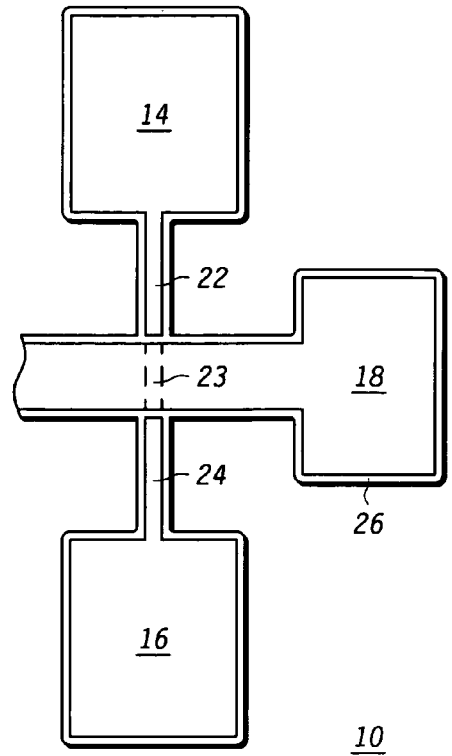
FIG. 3 illustrates in plan-view form further processing of the semiconductor device of FIG. 2.

Illustrated in FIG. 3 is the semiconductor device 10 of FIG. 2 after deposition of a dielectric material 26 that surrounds all exposed outside surfaces of the source/drain contact regions 14 and 16, the extension regions 22 and 24 and the gate feature 18. In one form the dielectric material 26 is silicon nitride but it should be understood that a different dielectric material may be used for dielectric material 26. The dielectric material 26 functions as an insulating spacer to the illustrated features of semiconductor device 10.

Figure 4:
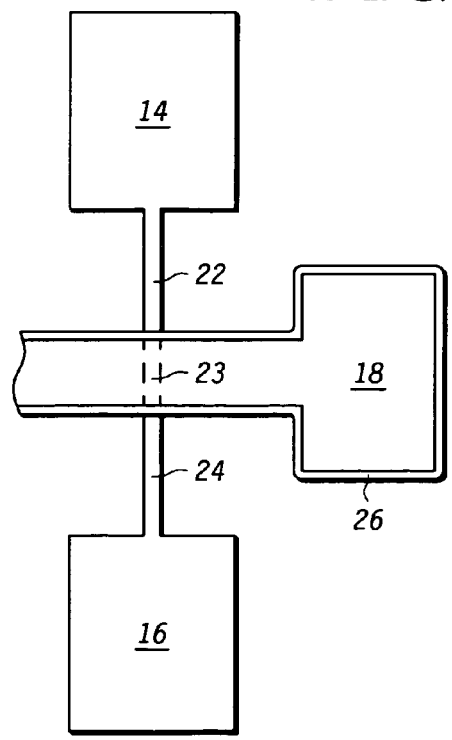
FIG. 4 illustrates in plan-view form further processing of the semiconductor device of FIG. 3.

Illustrated in FIG. 4 is further processing of the semiconductor device 10 of FIG. 3. A photoresist mask (not shown) is formed around the gate feature 18. An etch is then performed. The etch is a conventional anisotropic etch or anisotropic etch with isotropic features. The anisotropic etch functions to etch exposed portions of dielectric material 26 to result in the illustrated thin sidewall spacer layer around gate feature 18 provided by remaining portions of dielectric material 26.

Figure 5:
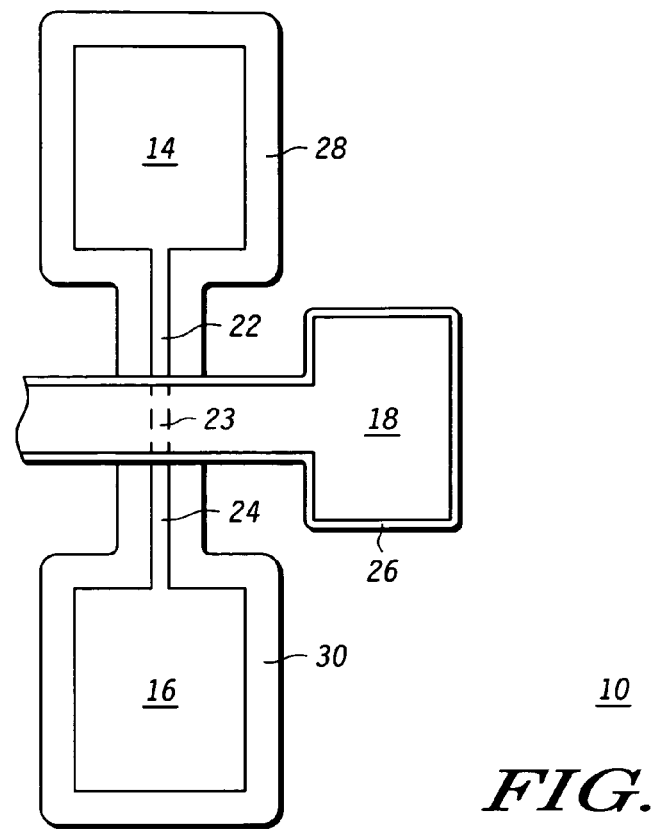
FIG. 5 illustrates in plan-view form further processing of the semiconductor device of FIG. 4.

Illustrated in FIG. 5 is the semiconductor device 10 of FIG. 4 after growth of sacrificial doping layers 28 and 30. Sacrificial doping layer 28 forms around source/drain contact region 14 and extension region 22. Sacrificial doping layer 30 forms around source/drain contact region 16 and extension region 24. The preferred method of growth of sacrificial doping layers 28 and 30 is selective epitaxial growth which allows growth only on exposed semiconductor surfaces. If gate feature 18 is a semiconductor material, growth of the sacrificial doping layer will occur on any exposed portions of the gate feature 18 as well. In the illustrated view of FIG. 5 there are no exposed portions of the gate feature 18 visible for the sacrificial doping layer to form, but in a subsequent view in FIG. 7 it will be apparent that the sacrificial doping material does form on exposed upper surfaces of the gate feature 18. In one form the sacrificial doping layers 28 and 30 are silicon germanium but it should be readily understood that a different semiconductor material such as silicon, silicon germanium carbon, silicon carbide, or a periodic table Group III-V material such as gallium arsenide may be used. Sacrificial doping layers 28 and 30 can be amorphous, polycrystalline, or mono-crystalline in form. As one form of implementing semiconductor device 10, sacrificial doping layers 28 and 30 are in-situ doped with source/drain dopants in the growth process to have a desired conductivity of predetermined strength.

Figure 6:
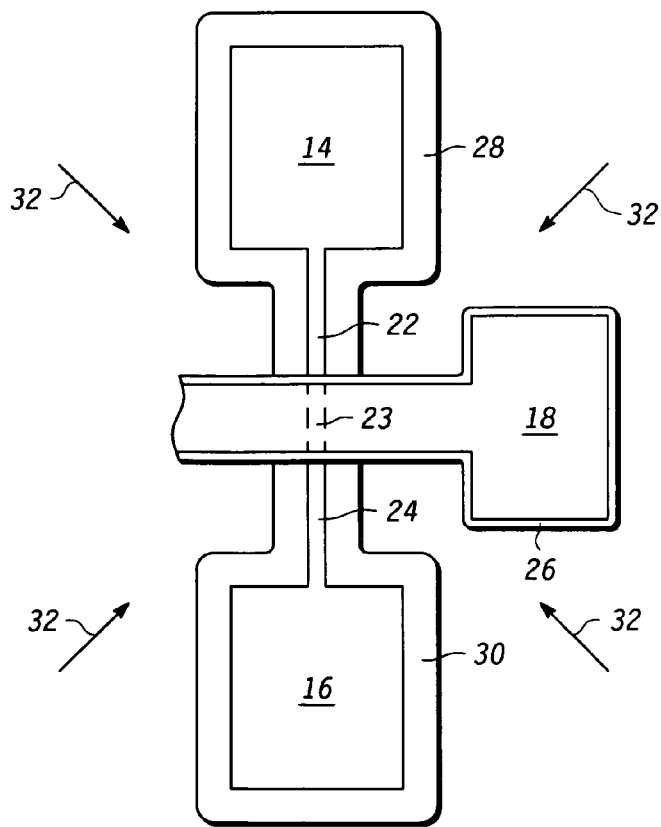
FIG. 6 illustrates in plan-view form further processing of the semiconductor device of FIG. 5.

Illustrated in FIG. 6 is a modified process to the processing of semiconductor device 10 of FIG. 5. After formation of the sacrificial doping layers 28 and 30, angle ion implantation is performed rather than the use of in-situ doping. In particular, semiconductor device 10 is exposed to angle implants 32 to place source/drain dopants into sacrificial doping layers 28 and 30. Angle implants 32 are such that an ion implant beam is applied at an angle that deviates from vertical by at least ten degrees, wherein vertical is with respect to a top surface of substrate 12. A high-tilt, low energy implant is used, which results in better uniformity of the source/drain dopant-distribution in sacrificial doping layers 28 and 30. The amount of energy selected depends upon the thickness of the sacrificial doping layers 28 and 30 as more energy may be used for thicker geometries that are implemented. A high-dose implant of source/drain dopants is used to ensure a high concentration of source/drain dopant in sacrificial doping layers 28 and 30. Because of the presence of sacrificial doping layers 28 and 30 extending around extension region 22 and extension region 24, damage to the extension region 22 and extension 24 is avoided even though a high dopant concentration is used.

Figure 7:
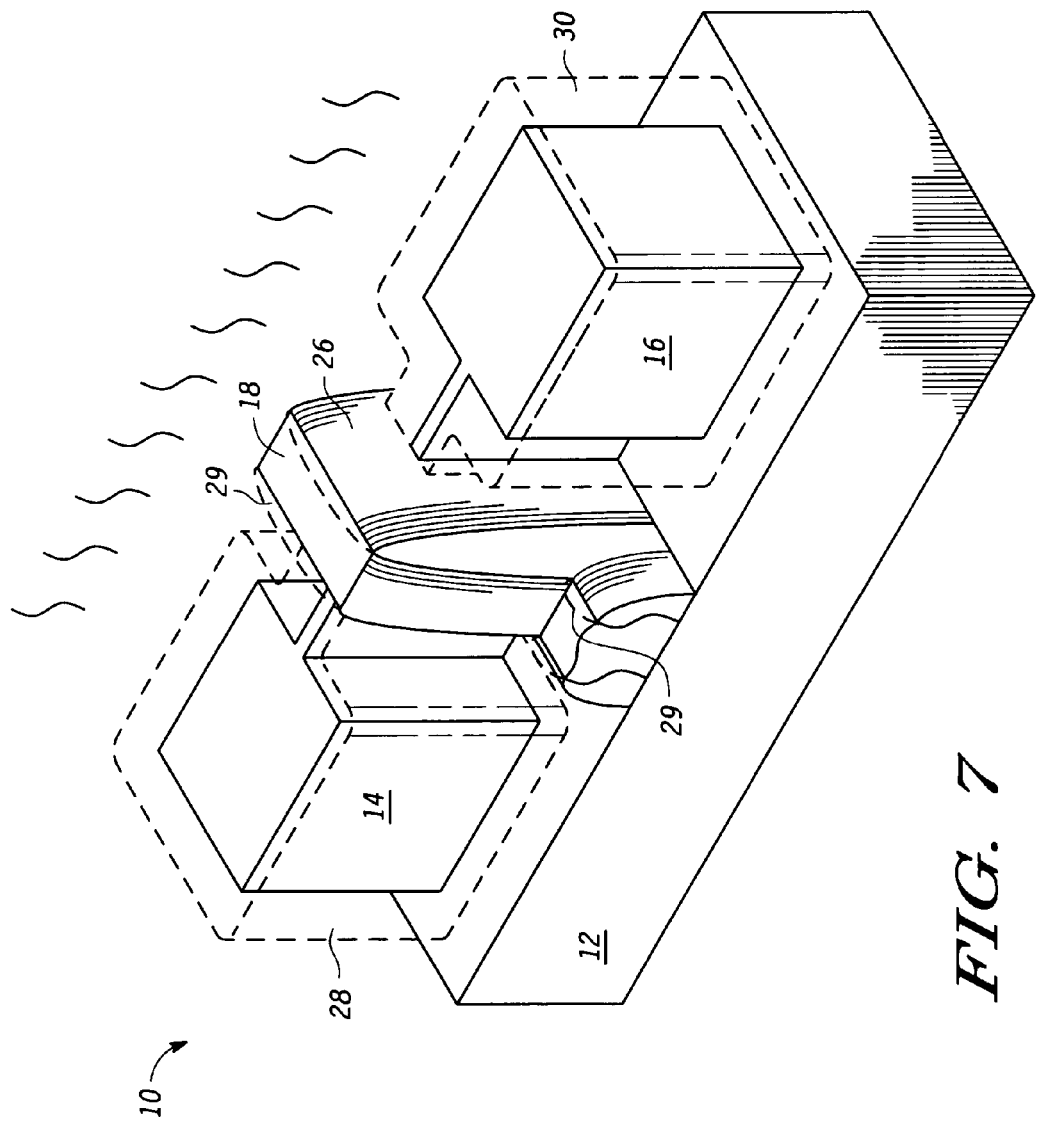
FIG. 7 illustrates in perspective form further processing of the semiconductor device of FIG. 5 or FIG. 6.

Illustrated in FIG. 7 in perspective is semiconductor device 10 of either FIG. 5 or FIG. 6 after an anneal is performed as indicated by the heat energy waves surrounding semiconductor device 10. The heating of semiconductor device 10 causes some of the source/drain dopants present in sacrificial doping layers 28 and 30 to evenly and thoroughly diffuse into source/drain contact regions 14 and 16. This heating process is preferably a rapid thermal anneal (RTA) of the semiconductor device 10. This heating process is sometimes referred to in the industry as solid source doping referring to the fact that the source of the ions which are driven into source/drain contact regions 14 and 16 are supplied from a solid material source of ions. In this application, the solid source is sacrificial doping layer 28 and sacrificial doping layer 30. In the view of semiconductor device 10 which is illustrated in FIG. 7, a sacrificial doping layer 29 may also be seen to have formed overlying exposed top surfaces of the gate feature 18 as a result of gate feature 18 being a semiconductor material. Therefore, the annealing step which is implemented in FIG. 7 will also function to drive ions of predetermined conductivity and strength into the gate feature 18. Whether the ion implanting of FIG. 5 or FIG. 6 is implemented, differing ion conductivities may be implemented for the gate feature 18 than the source/drain contact regions 14 and 16.

Illustrated in FIG. 8 is the semiconductor device of FIG. 7 after removing the sacrificial doping layers 28 and 30. It should be noted that sacrificial doping layer 29 illustrated only in FIG. 7 is also removed. Sacrificial doping layers 28, 29, and 30 are removed by applying an etchant that is selective between these layers and the fin material formed by extension regions 22 and 24. In one form where fin 20 is silicon and the sacrificial doping layers 28, 29, and 30 are silicon germanium, the etch chemistry is ammonium hydroxide and hydrogen peroxide. Removing all or substantially all of sacrificial doping layers 28 and 30 results in lower contact resistance and lower parasitic capacitance. It should be noted that sacrificial doping layers 28, 29 and 30 have been used in a sacrificial manner to permit high dosage ion implantation or high dosage insitu doping without damaging either the extension regions 22 and 24 or the source/drain contact regions 14 and 16. While the sacrificial doping layers 28, 29 and 30 may themselves be damaged by the ion implantation, such damage is irrelevant since the layers are not ultimately used as a functional portion of the resulting semiconductor device 10.

It should be noted that if, in an alternative form, gate feature 18 in FIG. 1 is implemented with a dielectric material rather than a conductive gate material, the dielectric material remains in place through the ion diffusion of the source, drain and gate. In FIG. 8 the dielectric gate feature 18 may be removed by a selective etch and replaced with a conductive material gate feature 18. This replacement of dielectric gate material may occur at other processing points in time, but is advantageous to be done after the ion implanting steps have occurred if it is desired to keep the gate feature 18 undoped.

Illustrated in FIG. 9 is alternative processing of the semiconductor device 10 of FIG. 7. In this form the sacrificial doping layers 28, 29 and 30 are not completely removed so that a reduced size sacrificial doping layer 28' and a reduced size sacrificial doping layer 30' results. In this alternative form a substantial portion, such as at least 40%, of sacrificial doping layers 28 and 30 are removed. It should be understood that various amounts of the sacrificial doping layers 28, 29 and 30 may be removed and the amount involves an engineering tradeoff. Not removing all of sacrificial doping layers 28 and 30 significantly reduces the gate extension resistance. However, the more of sacrificial doping layers 28 and 30 that are left, increased parasitic capacitance associated with the gate feature 18 and source/drain contact regions 14 and 16 results.

By now it should be appreciated that there has been provided a method for forming a semiconductor structure having a fin that is not damaged from proper doping of the source/drain regions and source/drain extensions. In one form there is provided a method for forming a semiconductor structure by providing a substrate and providing a semiconductor structure over the substrate. The semiconductor structure has a semiconductor fin, a first source/drain contact region adjacent to a first end of the semiconductor fin, a second source/drain contact region adjacent to a second end of the semiconductor fin, and a gate feature along a middle portion of a first side of the semiconductor fin. A first sacrificial doping layer is formed on the first side of the semiconductor fin between the first source/drain contact region and the gate feature and a second sacrificial doping layer on the first side of the semiconductor fin between the second source/drain contact and the gate feature. The first and second sacrificial doping layers are heated. After the heating, at least a substantial portion of the first sacrificial doping layer and at least a substantial portion of the second sacrificial doping layer are removed. In one form the first and second sacrificial doping layers are implanted with source/drain dopants prior to the heating. In another form the first and second sacrificial doping layers are deposited in situ doped with source/drain dopants. In one form the gate feature is replaced with a gate. In yet another form the gate feature is a gate separated from the semiconductor fin by a gate dielectric. In yet another form a sidewall spacer is formed adjacent to the gate feature prior to forming the first and second sacrificial doping layers. In yet another form the semiconductor fin is of a material that is selectively etchable with respect to the first and second sacrificial doping layers. In yet another form the semiconductor fin is silicon, the first and second sacrificial doping layers is silicon germanium, and removing the first sacrificial doping layer and the second sacrificial doping layer is performed by applying an etchant that is selective between silicon and silicon germanium. In another form the etchant is $NH_4$ and $H_2O_2$. In yet another form the first and second sacrificial doping layers are formed by epitaxially growing silicon germanium. In another form the first and second sacrificial doping layers are implanted with source/drain dopants at an angle that deviates from vertical by at least ten degrees, wherein vertical is with respect to a top surface of the substrate. In yet another form the gate feature is provided along a middle portion of a second side of the semiconductor fin. In one form the first sacrificial doping layer is formed on the second side of the semiconductor fin between the gate feature and the first source/drain contact region and the second sacrificial doping layer is formed on the second side of the semiconductor fin between the gate feature and the second source/drain contact region. In another form the first and second sacrificial doping layers are a selected one of the group consisting of amorphous and polycrystalline.

In yet another form there is herein provided a method for forming a FinFET structure. A substrate is provided and a semiconductor fin is provided having a height and a width, wherein the height is at least five times greater than the width. A gate feature is provided along a middle portion of the semiconductor fin, the gate feature having a first side and a second side. A first sacrificial doping layer is formed on the semiconductor fin adjacent to and spaced from the first side of the semiconductor fin, and a second sacrificial layer is formed on the semiconductor fin adjacent to and spaced from the second side of the gate feature, wherein the first and second sacrificial doping layers are doped with a source/drain dopant material. The first and second sacrificial doping layers are heated to cause some of the source/drain dopants to diffuse into the first and second source/drain contact regions. An etchant is applied to the first and second sacrificial doping layers. In one form a sidewall spacer is formed adjacent to the gate feature prior to forming the first and second sacrificial doping layers. In another form the etchant is selective between the semiconductor fin and the first and second sacrificial doping layers. In yet another form the first and second sacrificial doping regions are formed by implanting the first and second sacrificial doping layers with the source/drain dopant material. In yet another form the first and second sacrificial layers are formed by depositing the first and second sacrificial layers in situ doped with the source/drain dopant material.

In yet another form there is herein provided a method of forming a semiconductor device structure. A semiconductor feature is provided having a height, width, and length protruding from a substrate. The semiconductor feature is characterized as having a first side of the height and length on a first side of the width and a second side of the height and length on a second side of the width. A gate feature is formed in a middle portion of the semiconductor feature on the first side, the second side, and the width, whereby a first source/drain extension region and a second source/drain extension region are uncovered by the gate feature. A sidewall spacer is formed on the gate feature. A dopant-transferring material is formed on the first and second source/drain extension regions. The dopant-transferring material is heated and then substantially removed. In another form the dopant-transferring material is a semiconductor material. In yet another form the dopant-transferring material is doped by a selected one of the group consisting of implanting and in-situ doping. In one form the sidewall spacer is a dielectric material and the dopant-transferring material is a different type of material than that of the semiconductor feature.

In the foregoing specification, the invention has been described with reference to specific embodiments. However, one of ordinary skill in the art appreciates that various modifications and changes can be made without departing from the scope of the present invention as set forth in the claims below. For example, while a single conductive gate has been illustrated, two or more electrically isolated gates may be implemented. In such an alternate form, gate feature 18 is formed as two physically separate conductive regions separated by a dielectric material.

Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

What is claimed is:

1. A method for forming a semiconductor structure, comprising:
    providing a substrate;
    providing a semiconductor structure over the substrate comprising a semiconductor fin, a first source/drain contact region adjacent to a first end of the semiconductor fin, a second source/drain contact region adjacent to a second end of the semiconductor fin, and a gate feature along a middle portion of a first side of the semiconductor fin;
    forming a first sacrificial doping layer on the first side of the semiconductor fin between the first source/drain contact region and the gate feature and a second sacrificial doping layer on the first side of the semiconductor fin between the second source/drain contact region and the gate feature;
    heating the first and second sacrificial doping layers;
    after the step of heating, removing at least a substantial portion of the first sacrificial doping layer and at least a substantial portion of the second sacrificial doping layer.

2. The method of claim 1 further comprising:
    implanting the first and second sacrificial doping layers with source/drain dopants prior to the step of heating.

3. The method of claim 1 wherein the step of forming the first and second sacrificial doping layers is further characterized as depositing the first and second sacrificial doping layers in situ doped with source/drain dopants.

4. The method of claim 1 further comprising replacing the gate feature with a gate.

5. The method of claim 1, wherein the gate feature is a gate separated from the semiconductor fin by a gate dielectric.

6. The method of claim 1 further comprising forming a sidewall spacer adjacent to the gate feature prior to the step of forming the first and second sacrificial doping layers.

7. The method of claim 1 wherein the semiconductor fin is of a material that is selectively etchable with respect to the first and second sacrificial doping layers.

8. The method of claim 1 wherein the semiconductor fin comprises silicon, the first and second sacrificial doping layers comprises silicon germanium, and removing at least the substantial portion of the first sacrificial doping layer and the second sacrificial doping layer comprises applying an etchant that is selective between silicon and silicon germanium.

9. The method of claim 8, wherein the etchant comprises $NH_4$ and $H_2O_2$.

10. The method of claim 1 wherein the step of forming the first and second sacrificial doping layers comprises epitaxially growing silicon germanium.

11. The method of claim 1 further comprising implanting the first and second sacrificial doping layers with source/drain dopants at an angle that deviates from vertical by at least ten degrees, wherein vertical is with respect to a top surface of the substrate.

12. The method of claim 1, wherein:
    the step of providing the semiconductor structure is further characterized as providing the gate feature along a middle portion of a second side of the semiconductor fin; and
    the step of forming the first and second sacrificial doping layers is further characterized as forming the first sacrificial doping layer on the second side of the semiconductor fin between the gate feature and the first source/drain contact region and as forming the second sacrificial doping layer on the second side of the semiconductor fin between the gate feature and the second source/drain contact region.

13. The method of claim 1, wherein the first and second sacrificial doping layers are further characterized as being a selected one of the group consisting of amorphous and polycrystalline.

14. A method for forming a FinFET structure, comprising:
    providing a substrate;

providing a semiconductor fin having a height and a width, wherein the height is at least five times greater than the width;

providing a gate feature along a middle portion of the semiconductor fin, the gate feature having a first side and a second side;

forming a first sacrificial doping layer on the semiconductor fin adjacent to and spaced from the first side of the semiconductor fin and a second sacrificial doping layer on the semiconductor fin adjacent to and spaced from the second side of the gate feature, wherein the first and second sacrificial doping layers are doped with a source/drain dopant material;

heating the first and second sacrificial doping layers to cause some of the source/drain dopants to diffuse into the semiconductor fin; and applying an etchant to the first and second sacrificial doping layers.

15. The method of claim 14 further comprising:
forming a sidewall spacer adjacent to the gate feature prior to forming the first and second sacrificial doping layers.

16. The method of claim 14 wherein the etchant is selective between the semiconductor fin and the first and second sacrificial doping layers.

17. The method of claim 14, wherein the step of forming the first and second sacrificial doping regions is further characterized as implanting the first and second sacrificial doping layers with the source/drain dopant material.

18. The method of claim 14 wherein the step of forming the first and second sacrificial doping layers is further characterized as depositing the first and second sacrificial doping layers in situ doped with the source/drain dopant material.

19. A method of forming a semiconductor device structure, comprising:
forming a semiconductor feature having a height, width, and length protruding from a substrate, the semiconductor feature characterized as having a first side of the height and length on a first side of the width and a second side of the height and length on a second side of the width;

forming a gate feature in a middle portion of the semiconductor feature on the first side, the second side, and the width, whereby a first source/drain extension region and a second source/drain extension region are uncovered by the gate feature;

forming a sidewall spacer on the gate feature;

forming a dopant-transferring material on the first and second source/drain extension regions;

heating the dopant-transferring material; and substantially removing the dopant-transferring material.

20. The method of claim 19 wherein:
the dopant-transferring material is doped by a selected one of the group consisting of implanting and in-situ doping;

the sidewall spacer comprises a dielectric material; and the dopant-transferring material is characterized as being comprised of a different type of material than that of the semiconductor feature.

* * * * *